US012696380B2

(12) United States Patent
Nakashima

(10) Patent No.: US 12,696,380 B2
(45) Date of Patent: Jul. 28, 2026

(54) MATCHING CIRCUIT BOARD AND SEMICONDUCTOR DEVICE

(71) Applicant: Sumitomo Electric Device Innovations, Inc., Yokohama (JP)

(72) Inventor: Ikuo Nakashima, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 236 days.

(21) Appl. No.: 18/437,713

(22) Filed: Feb. 9, 2024

(65) Prior Publication Data

US 2024/0292520 A1 Aug. 29, 2024

(30) Foreign Application Priority Data

Feb. 24, 2023 (JP) ................................. 2023-027503

(51) Int. Cl.
| | |
|---|---|
| *H05K 1/02* | (2006.01) |
| *H05K 1/16* | (2006.01) |
| *H10W 70/685* | (2026.01) |

(52) U.S. Cl.
CPC .......... *H05K 1/0251* (2013.01); *H05K 1/162* (2013.01); *H10W 70/685* (2026.01); *H05K 2201/09645* (2013.01)

(58) Field of Classification Search
None
See application file for complete search history.

(56) References Cited

U.S. PATENT DOCUMENTS

| | | | | |
|---|---|---|---|---|
| 5,959,846 A | * | 9/1999 | Noguchi ................. | H01L 24/97 |
| | | | | 361/764 |
| 2019/0326674 A1 | * | 10/2019 | Kang ...................... | H01L 23/66 |
| 2023/0145085 A1 | * | 5/2023 | Fujita ...................... | H01G 4/12 |
| | | | | 361/301.4 |

FOREIGN PATENT DOCUMENTS

JP S63-086904 A 4/1998

* cited by examiner

*Primary Examiner* — Timothy J Thompson
*Assistant Examiner* — John B Freal
(74) *Attorney, Agent, or Firm* — Volpe Koenig

(57) ABSTRACT

A matching circuit board includes a first substrate, a second substrate, and a third substrate. The first substrate includes a first insulator, a first metal pattern, and first conductive vias. The second substrate includes a second insulator, a second metal pattern, and second conductive vias. The third substrate includes a third insulator and a third metal pattern. A capacitor is constituted by the first metal pattern, the second insulator, and the second metal pattern, and a capacitor is constituted by the first metal pattern, the first insulator, and the third metal pattern. The second metal pattern is electrically connected to the third metal pattern through the second conductive vias and the first conductive vias. The first metal pattern is separated from the first conductive vias to be positioned inside the first conductive vias, and is insulated from the first conductive vias.

15 Claims, 10 Drawing Sheets

MATCHING CIRCUIT BOARD AND SEMICONDUCTOR DEVICE

TECHNICAL FIELD

The present disclosure relates to a matching circuit board and a semiconductor device. This application is based upon and claims the benefit of priority from Japanese Patent Application No. 2023-027503, filed on Feb. 24, 2023, the entire contents of which are incorporated herein by reference.

BACKGROUND

JP S63-86904 discloses an example of a high frequency amplification device. The high frequency amplification device is an internal matching type high output field effect transistor. The device includes a package, an amplifying element that is implemented on the package to amplify a high frequency signal, an input matching circuit board that is connected between an input terminal of the amplifying element and an input terminal of the package to perform impedance conversion, and an output matching circuit board that is connected between an output terminal of the amplifying element and an output terminal of the package to perform impedance conversion.

SUMMARY

A matching circuit board according to an embodiment of the present disclosure includes a first substrate, a second substrate provided to face a first surface of the first substrate, and a third substrate provided to face a second surface opposite to the first surface of the first substrate. The first substrate includes a first insulator, a first metal pattern provided on a main surface of the first insulator, and a plurality of first conductive vias provided at a peripheral edge of the first insulator. The second substrate includes a second insulator, a second metal pattern provided on a main surface of the second insulator, and a plurality of second conductive vias provided at a peripheral edge of the second insulator. The third substrate includes a third insulator and a third metal pattern provided on a main surface of the third insulator. In the matching circuit board, a first capacitor is constituted by the first metal pattern, the second insulator, and the second metal pattern, and a second capacitor is constituted by the first metal pattern, the first insulator, and the third metal pattern. The second metal pattern is electrically connected to the third metal pattern through the plurality of second conductive vias and the plurality of first conductive vias. The first metal pattern is separated from the plurality of first conductive vias to be positioned inside the plurality of first conductive vias, and is configured to be insulated from the plurality of first conductive vias.

DETAILED DESCRIPTION

Problem Solved by Present Disclosure

Figure 1:
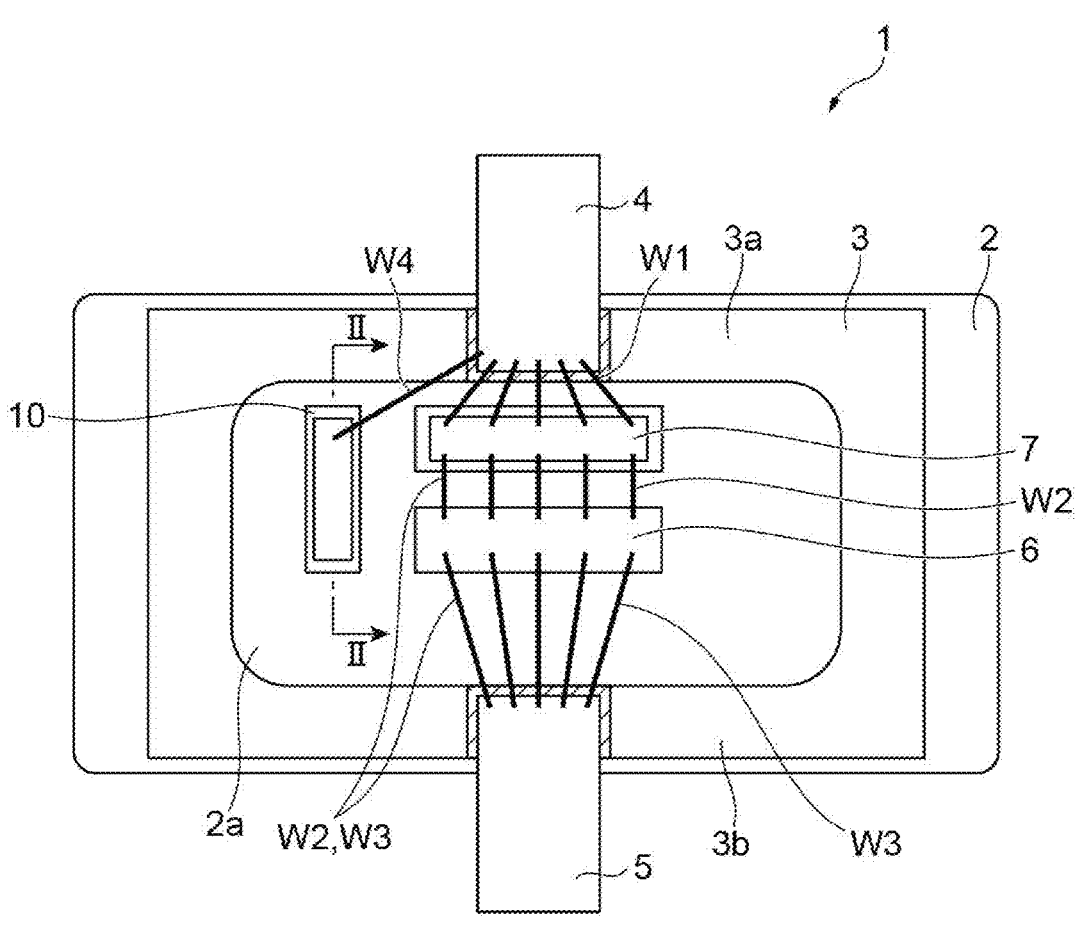
FIG. 1 is a plan view illustrating a semiconductor device according to an embodiment.

In the semiconductor device described in JP S63-86904, the transistor (amplifying element) and a matching circuit component are implemented on a package substrate with a conductive adhesive (metal paste). The semiconductor device may have, for example, a configuration in which a negative voltage is applied to the matching circuit component, and migration from the metal paste occurs toward a ground electrode as being pulled by a negative electric field generated by this configuration. In particular, when a silver (Ag) paste is used as the metal paste, silver is easily pulled by a negative electric field, and thus ion migration may occur.

Advantageous Effect of Present Disclosure

According to the present disclosure, migration of a metal paste can be suppressed.

DESCRIPTION OF EMBODIMENT OF PRESENT DISCLOSURE

First, contents of an embodiment of the present disclosure will be listed and described.

(1) A matching circuit board according to an embodiment of the present disclosure includes a first substrate, a second substrate provided to face a first surface of the first substrate, and a third substrate provided to face a second surface opposite to the first surface of the first substrate. The first substrate includes a first insulator, a first metal pattern provided on a main surface of the first insulator, and a plurality of first conductive vias provided at a peripheral edge of the first insulator. The second substrate includes a second insulator, a second metal pattern provided on a main surface of the second insulator, and a plurality of second conductive vias provided at a peripheral edge of the second insulator. The third substrate includes a third insulator and a third metal pattern provided on a main surface of the third insulator. In the matching circuit board, a first capacitor is constituted by the first metal pattern, the second insulator, and the second metal pattern, and a second capacitor is constituted by the first metal pattern, the first insulator, and the third metal pattern. The second metal pattern is electrically connected to the third metal pattern through the plurality of second conductive vias and the plurality of first conductive vias. The first metal pattern is separated from the plurality of first conductive vias to be positioned inside the plurality of first conductive vias, and is configured to be insulated from the plurality of first conductive vias.

In the matching circuit board, the first metal pattern is separated from the plurality of first conductive vias to be positioned inside the plurality of first conductive vias. In this case, the first metal pattern has a length or a width smaller than the second metal pattern or the third metal pattern. As a result, an electric field leaking to an outside of the matching circuit board (particularly, an outside of a side surface) decreases. In addition, the plurality of first conductive vias and the plurality of second conductive vias are disposed outside the metal pattern to which the voltage is applied, in the matching circuit board. As a result, the electric field leaking to the outside of the matching circuit board further decreases. From the above, according to this matching circuit board, migration of the metal paste is suppressed.

(2) In the matching circuit board of the above (1), the third substrate may have a plurality of third conductive vias disposed at a peripheral edge of the third insulator and a back-surface metal pattern provided on a bottom surface opposite to the main surface of the third insulator. The third metal pattern may be electrically connected to the back-surface metal pattern through the plurality of third conductive vias. In this case, the third metal pattern can be easily used as a ground electrode.

(3) In the matching circuit board of the above (1) or (2), the plurality of first conductive vias may be electrically connected to each other, and the plurality of first conductive vias may have a guard ring structure surrounding the first metal pattern. In this case, the electric field leaking to the outside of the matching circuit board further decreases. Thus, according to this matching circuit board, the migration of the metal paste is further suppressed.

(4) The matching circuit board according to any one of the above (1) to (3) may further include a fourth substrate provided on the second substrate. The fourth substrate may include a fourth insulator, a fourth metal pattern provided on a main surface of the fourth insulator, and a plurality of fourth conductive vias provided at a peripheral edge of the fourth insulator. The fourth metal pattern may be electrically connected to the first metal pattern. The plurality of fourth conductive vias may be electrically connected to at least one of the second metal pattern and the second conductive vias. The fourth metal pattern may be separated from the plurality of fourth conductive vias to be positioned inside the plurality of fourth conductive vias, and may be configured to be insulated from the plurality of fourth conductive vias. In this case, a predetermined voltage can be easily applied to the first metal pattern positioned in an inner layer by using the fourth substrate. In addition, the plurality of fourth conductive vias are disposed outside the metal pattern to which the voltage is applied, in this matching circuit board, and thus the electric field leaking to the outside of the matching circuit board further decreases. From the above, according to this matching circuit board, the migration of the metal paste is further suppressed.

(5) In the matching circuit board of the above (4), the plurality of fourth conductive vias may be electrically connected to each other, and the plurality of fourth conductive vias may have a guard ring structure surrounding the fourth metal pattern. In this case, the electric field leaking to the outside of the matching circuit board further decreases. Thus, according to this matching circuit board, the migration of the metal paste is further suppressed.

(6) In the matching circuit board according to any one of the above (1) to (5), a reference potential may be supplied to at least one of the second metal pattern and the third metal pattern. In this case, the second metal pattern and the third metal pattern can be easily used as the ground electrode.

(7) The matching circuit board according to any one of the above (1) to (6) may further include a fifth substrate. The fifth substrate may have a fifth insulator, a fifth metal pattern provided on a main surface of the fifth insulator, and a plurality of fifth conductive vias provided at a peripheral edge of the fifth insulator. In this matching circuit board, the fifth metal pattern may form an inductor. In this case, an inductor which is a circuit unit other than the capacitor can be provided on the matching circuit board, and various circuit configurations can be achieved.

(8) The matching circuit board of the above (7) may further include a sixth substrate provided to face a first surface of the fifth substrate, and a seventh substrate provided to face a second surface opposite to the first surface of the fifth substrate. The sixth substrate may include a sixth insulator, a sixth metal pattern provided on a main surface of the sixth insulator, and a plurality of sixth conductive vias provided at a peripheral edge of the sixth insulator. The seventh substrate may include a seventh insulator, a seventh metal pattern provided on a main surface of the seventh insulator, and a plurality of seventh conductive vias provided at a peripheral edge of the seventh insulator. The sixth metal pattern and the seventh metal pattern may be electrically connected to each other through the plurality of fifth conductive vias and the plurality of sixth conductive vias.

(9) The matching circuit board of the above (8) may further include an eighth substrate provided to face a first surface of the sixth substrate. The eighth substrate may include an eighth insulator, an eighth metal pattern provided on a main surface of the eighth insulator, and a plurality of eighth conductive vias provided at a peripheral edge of the eighth insulator. A ninth metal pattern may be provided to be separated from the fourth metal pattern on the main surface of the fourth insulator. The ninth metal pattern may be electrically connected to the eighth metal pattern. The plurality of fourth conductive vias may be electrically connected to at least one of the third metal pattern and the eighth conductive vias. The ninth metal pattern may be separated from the plurality of fourth conductive vias to be positioned inside the plurality of fourth conductive vias, and may be configured to be insulated from the plurality of fourth conductive vias.

(10) In the matching circuit board of the above (9), the fifth metal pattern may be electrically connected to the fourth metal pattern and the ninth metal pattern.

A semiconductor device according to an embodiment of the present disclosure includes the matching circuit board according to any one of the above (1) to (10), a semiconductor element, and a base substrate mounted the matching circuit board and the semiconductor thereon. In this semiconductor device, the matching circuit board and the base substrate are bonded by a metal paste. In this semiconductor device, as described above, the electric field leaking to the outside of the matching circuit board decreases. Thus, according to the semiconductor device including any of the matching circuit boards described above, the migration of the conductive paste is suppressed.

Details of Embodiment of Present Disclosure

Specific examples of a matching circuit board and a semiconductor device according to an embodiment of the present disclosure will be described below with reference to the drawings. In the following description, the same reference signs will be used for the same elements or elements having the same functions, and the redundant description is omitted. Note that, the present invention is not limited to these examples, is described by the claims, and is intended to include meanings equivalent to the claims and all changes within the scope of the claims.

A semiconductor device including a matching circuit board will be described with reference to FIG. 1. FIG. 1 is a plan view illustrating the semiconductor device according to the embodiment. As illustrated in FIG. 1, a semiconductor device 1 includes a base substrate 2, a frame body 3, a first lead 4, a second lead 5, a transistor 6 (semiconductor element), a matching circuit component 7, and a matching circuit board 10. The semiconductor device 1 may further include a lid provided above the frame body 3.

The base substrate 2 is, for example, a conductor substrate such as a stacked substrate of copper and molybdenum. A reference potential such as a ground potential is supplied to the base substrate 2. The frame body 3 provided on the base substrate 2 and the lid are formed by using, for example, a dielectric made of resin such as FR-4 (flame retardant type 4) or ceramic. The first lead 4 is attached to a long side 3a of the frame body 3, and the second lead 5 is attached to a long side 3b of the frame body 3. The transistor 6, the matching circuit component 7, and the matching circuit board 10 are disposed on the base substrate 2 and inside the frame body 3. The transistor 6, the matching circuit component 7, and the matching circuit board 10 are mounted on the base substrate 2 by a metal paste P such as a silver (Ag) paste (see FIG. 2).

The transistor 6 is a field effect transistor, and is, for example, a semiconductor chip such as a gallium nitride high electron mobility transistor (GaN HEMT). The matching circuit component 7 includes, for example, a capacitor, and is a component that matches an impedance of the first lead 4 with an impedance of the transistor 6. For example, the first lead 4 is an input lead, and the second lead 5 is an output lead. The first lead 4 is connected to the matching circuit component 7 by bonding wires W1. The matching circuit component 7 is connected to the transistor 6 by bonding wires W2. The transistor 6 is connected to the second lead 5 by bonding wires W3. The matching circuit board 10 is connected to the first lead 4 by a bonding wire W4.

Figure 2:
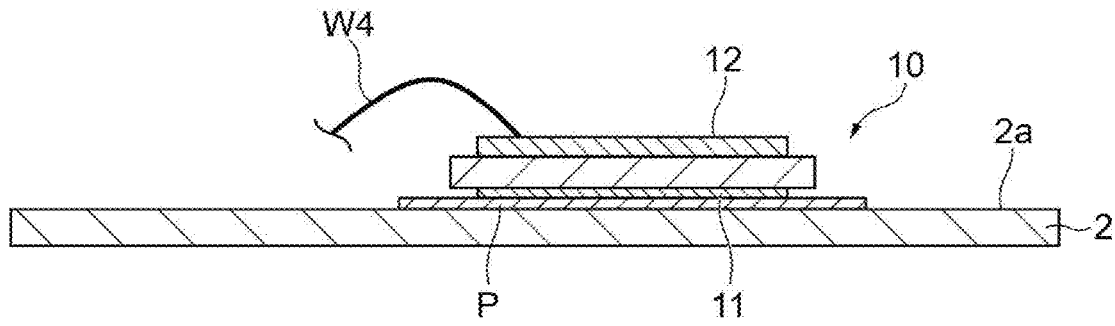
FIG. 2 is a cross-sectional view of a matching circuit board of the semiconductor device illustrated in FIG. 1 taken along line II-II.

FIG. 2 is a diagram illustrating a cross section taken along line II-II near the matching circuit board 10 in the semiconductor device 1. Although described in detail later, the matching circuit board 10 is a stacked circuit component (e.g. a capacitor) produced by sequentially stacking a plurality of metal patterns and a plurality of insulators. As illustrated in FIG. 2, the matching circuit board 10 is implemented on a main surface 2a of the base substrate 2 by a conductive metal paste P. The metal paste P is, for example, a conductive silver (Ag) paste. A back-surface metal pattern 11 (solid electrode) is provided on a back surface of the matching circuit board 10. The back-surface metal pattern 11 is bonded to the metal paste P. Thus, the matching circuit board 10 is implemented on the base substrate 2, and a ground potential supplied to the base substrate 2 is supplied to a ground electrode of the matching circuit board 10.

Figure 3:
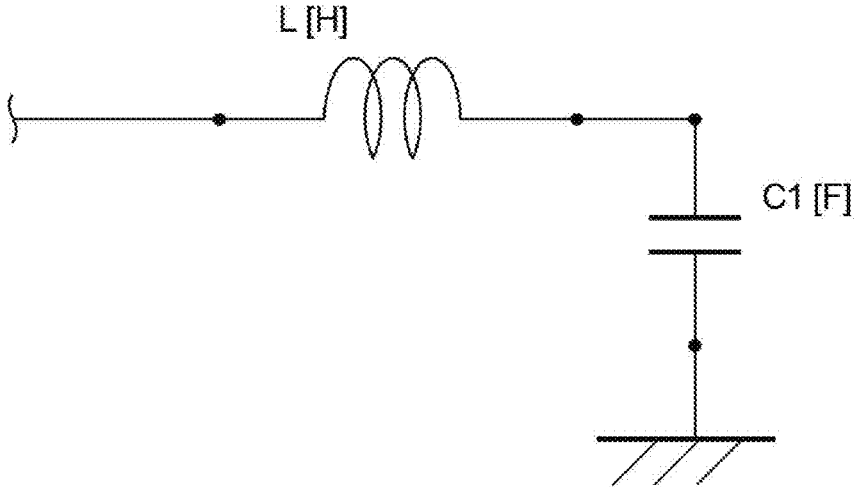
FIG. 3 is a diagram illustrating an example of a circuit including the matching circuit board illustrated in FIG. 2.

The first lead 4 is connected to an electrode pad 12 of the matching circuit board 10 through the bonding wire W4. When a negative voltage (−) is applied to the first lead 4 (a positive voltage (+) is applied to the second lead 5), migration of metal (e.g. silver) from the metal paste P (silver paste) toward the ground electrode may occur due to a negative electric field generated in this manner. As will be described below, the matching circuit board 10 according to the present embodiment has a configuration for reducing such an electric field. FIG. 3 illustrates an example of a circuit of the capacitor configuration illustrated in FIG. 2.

Figure 4:
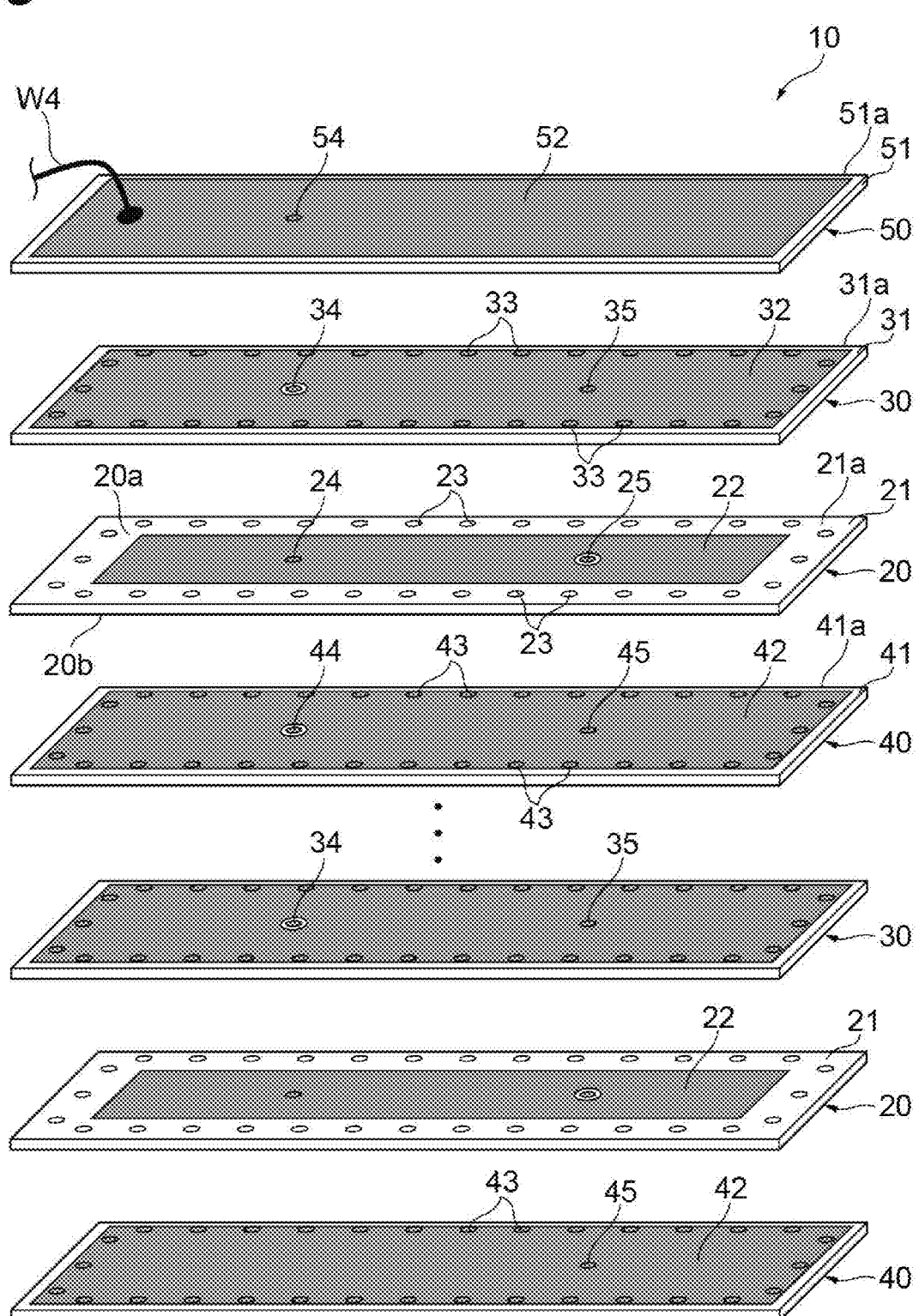
FIG. 4 is an exploded perspective view of the matching circuit board illustrated in FIG. 2.

FIG. 4 is an exploded perspective view of the matching circuit board 10 illustrated in FIG. 2. As illustrated in FIG. 4, the matching circuit board 10 includes a plurality of first substrates 20, a plurality of second substrates 30, and a plurality of third substrates 40. The matching circuit board 10 is, for example, a low temperature co-fired ceramics (LTCC) board.

The first substrate 20 is a substrate including an electrode layer to which a voltage is applied, and is disposed between the second substrate 30 and the third substrate 40. The first substrate 20 includes an insulator 21 (first insulator), a metal pattern 22 (first metal pattern) provided on a main surface 21a of the insulator 21, a plurality of conductive vias 23 (first conductive vias) disposed to surround the metal pattern 22, a conductive via 24 positioned in the metal pattern 22, and a conductive via 25 positioned in the metal pattern 22. The insulator 21 is, for example, an insulating substrate made of a ceramic material. The insulator 21 may be a PCB substrate, and in this case, stacking is performed by using a prepreg. The following configuration of the insulator is also similar.

The metal pattern 22 is formed to cover a central region excluding the plurality of conductive vias 23 provided at a peripheral edge of the main surface 21a of the insulator 21, and is not electrically connected to the conductive vias 23. The metal pattern 22 is formed such that a size in a planar direction is smaller than a metal pattern 32 of the second substrate 30 or a metal pattern 42 of the third substrate 40 to be described later. The metal pattern 22 may have a size of, for example, 50% or more and 90% or less with respect to an area of the metal pattern 32 or the metal pattern 42. The metal pattern 22 is made of, for example, copper or silver.

Each of the plurality of conductive vias 23 is a conductive via made of a metal material (e.g. copper, gold, or silver) provided on an inner peripheral surface of a through-hole penetrating the insulator 21 from a front surface to a back surface (or filled in the through-hole). The conductive via 23 electrically connects an electrode positioned on the front surface of the insulator 21 to an electrode positioned on the back surface of the insulator 21. The conductive vias 23 are disposed to be separated from each other in the planar direction. An isolation distance between the adjacent conductive vias 23 may be, for example, 50 μm or more and 500 μm or less. The plurality of conductive vias 23 are disposed at equal intervals, for example.

The conductive via 24 is a conductive via for electrically connecting a metal pattern 52 of a fourth substrate 50 to the metal pattern 22 of another first substrate 20. Similarly to the conductive via 23, the conductive via 24 is a conductive via made of a metal material provided on an inner peripheral surface of a through-hole penetrating the insulator 21 from the front surface to the back surface (or filled in the through-hole). The conductive via 24 is provided inside the metal pattern 22 in the planar direction. The conductive via 24 is connected and conductive to the metal pattern 22 on the front surface, and is electrically connected to a conductive via 34 of the second substrate 30. On the other hand, the conductive via 24 is electrically connected to a conductive via 44 of the third substrate 40 on the back surface.

The conductive via 25 is a conductive via for electrically connecting the metal pattern 32 of the second substrate 30 to the metal pattern 42 of the third substrate 40. Similarly to the conductive via 24, the conductive via 25 is a conductive via made of a metal material provided on an inner peripheral surface of a through-hole penetrating the insulator 21 from the front surface to the back surface (or filled in the through-hole). The conductive via 25 is provided inside the metal pattern 22 in the planar direction. The conductive via 25 is electrically connected to a conductive via 35 of the second substrate 30 on the front surface, and is electrically connected to a conductive via 45 of the third substrate 40 on the back surface. The conductive via 25 is a member that connects the metal pattern 32 functioning as the ground electrode to the metal pattern 42, and is provided to be exposed in a gap (e.g. a circular non-conductive space) provided inside the metal pattern 22 not to be electrically connected to the metal pattern 22 to which a voltage is applied. That is, the conductive via 25 is insulated from the metal pattern 22.

The second substrate 30 includes an electrode layer to which a ground voltage is applied, and is provided and stacked to face a first surface 20a of the first substrate 20. The second substrate 30 includes an insulator 31 (second insulator), a metal pattern 32 (second metal pattern) provided on a main surface 31a of the insulator 31, a plurality of conductive vias 33 (second conductive vias) disposed at a peripheral edge of the metal pattern 32, a conductive via 34 positioned in the metal pattern 32, and a conductive via 35 positioned in the metal pattern 32. Similarly to the insulator 21, the insulator 31 may be, for example, a PCB substrate or an insulating substrate made of a ceramic material.

The metal pattern 32 is formed to cover substantially the entire surface of the main surface 31a of the insulator 31 except for a peripheral edge. An area of the metal pattern 32 is larger than an area of the metal pattern 22 facing each other with the insulator 31 interposed therebetween, and is the same size as the metal pattern 42 of the third substrate 40. The metal pattern 32 is made of, for example, copper or silver.

Each of the plurality of conductive vias 33 is a conductive via made of a metal material (e.g. copper, gold, or silver) provided on an inner peripheral surface of a through-hole penetrating the insulator 31 from a front surface to a back surface (or filled in the through-hole). The conductive via 33 electrically connects the metal pattern 32 positioned on the front surface of the insulator 31 to an electrode positioned on the back surface of the insulator 31. The conductive vias 33 are disposed to be separated from each other in the planar direction. An isolation distance between the adjacent conductive vias 33 may be, for example, 50 μm or more and 500 μm or less. The plurality of conductive vias 33 are disposed at equal intervals, for example. Unlike the conductive via 23, the plurality of conductive vias 33 are electrically connected to the metal pattern 32 on the front surface. The conductive via 33 is electrically connected to the conductive via 23.

The conductive via 34 is a conductive via for electrically connecting the metal pattern 52 of the fourth substrate 50 to the metal pattern 22 of the first substrate 20. Similarly to the conductive via 33, the conductive via 34 is a conductive via made of a metal material provided on an inner peripheral surface of a through-hole penetrating the insulator 31 from the front surface to the back surface (or filled in the through-hole). The conductive via 34 is provided inside the metal pattern 32 in the planar direction. The conductive via 34 is connected to a conductive via 54 of the fourth substrate 50 on the front surface and is conductive. On the other hand, the conductive via 34 is electrically connected to the metal pattern 22 or the conductive via 24 of the first substrate 20 on the back surface. The conductive via 34 is a member that connects the metal pattern 52 functioning as a voltage application layer to the metal pattern 22, and is provided to be exposed to a gap (e.g. a circular non-conductive space) provided in the metal pattern 32 not to be electrically connected to the metal pattern 32 to which a ground voltage is applied. That is, the conductive via 34 is insulated from the metal pattern 32.

The conductive via 35 is a member for electrically connecting the metal pattern 32 of the second substrate 30 to the metal pattern 42 of the third substrate 40. Similarly to the conductive via 34, the conductive via 35 is a conductive via made of a metal material provided on an inner peripheral surface of a through-hole penetrating the insulator 31 from the front surface to the back surface (or filled in the through-hole). The conductive via 35 is provided inside the metal pattern 32 in the planar direction. The conductive via 35 is connected to the metal pattern 32 of the second substrate 30 on the front surface, and is electrically connected to the conductive via 25 of the first substrate 20 on the back surface.

Similarly to the second substrate 30, the third substrate 40 includes an electrode layer to which a ground voltage is applied, and is provided and stacked to face a second surface 20b which is the back surface of the first substrate 20. The third substrate 40 includes an insulator 41 (third insulator), a metal pattern 42 (third metal pattern) provided on a main surface 41a of the insulator 41, a plurality of conductive vias 43 (third conductive vias) disposed at a peripheral edge of the metal pattern 42, a conductive via 44 positioned in the metal pattern 42, and a conductive via 45 positioned in the metal pattern 42. A basic configuration of the third substrate 40 is the same as the configuration of the second substrate 30.

Similarly to the insulators 21 and 31, the insulator 41 is, for example, a PCB substrate or an insulating substrate made of a ceramic material. Similarly to the metal pattern 32, the metal pattern 42 is formed to cover substantially the entire surface of the main surface 41a of the insulator 41 except for a peripheral edge. An area of the metal pattern 42 is larger than an area of the metal pattern 22 facing each other with the insulator 21 interposed therebetween, and is the same size as the metal pattern 32 of the second substrate 30. The metal pattern 42 is made of, for example, copper or silver.

Each of the plurality of conductive vias 43 is a conductive via made of a metal material provided on an inner peripheral surface of a through-hole penetrating the insulator 41 from a front surface to a back surface (or filled in the through-hole). The conductive via 43 electrically connects the metal pattern 42 positioned on the front surface of the insulator 41 to an electrode positioned on the back surface of the insulator 41. The conductive vias 43 are disposed to be separated from each other in the planar direction. An isolation distance between the adjacent conductive vias 43 may be, for example, 50 μm or more and 500 μm or less. The plurality of conductive vias 43 are disposed at equal intervals, for example. Unlike the conductive via 23, the plurality of conductive vias 43 are electrically connected to the metal pattern 42 on the front surface. The conductive via 43 is electrically connected to the conductive via 23.

The conductive via 44 is a conductive via for electrically connecting the metal pattern 22 of the first substrate 20 to the metal pattern 22 of another first substrate 20. Similarly to the conductive via 43, the conductive via 44 is a conductive via made of a metal material provided on an inner peripheral surface of a through-hole penetrating the insulator 41 from the front surface to the back surface (or filled in the through-hole). The conductive via 44 is provided inside the metal pattern 42 in the planar direction. The conductive via 44 is connected to the conductive via 24 of the first substrate 20 on the front surface and is conductive. On the other hand, the conductive via 44 is electrically connected to the metal pattern 22 or the conductive via 24 of another first substrate 20 on the back surface. The conductive via 44 is a member that connects the metal pattern 22 functioning as a voltage application layer to another metal pattern 22, and is provided to be exposed to a gap (e.g. a circular non-conductive space) provided in the metal pattern 42 not to be electrically connected to the metal pattern 42 to which a ground voltage is applied. That is, the conductive via 44 is insulated from the metal pattern 42.

The conductive via 45 is a member for electrically connecting the metal pattern 42 of the third substrate 40 to the metal pattern 32 of another second substrate 30. Similarly to the conductive via 44, the conductive via 45 is a conductive via made of a metal material provided on an inner peripheral surface of a through-hole penetrating the insulator 41 from the front surface to the back surface (or filled in the through-hole). The conductive via 45 is provided inside the metal pattern 42 in the planar direction. The conductive via 45 is connected to the metal pattern 42 of the third substrate 40 on the front surface, and is electrically connected to the conductive via 35 of another second substrate 30 on the back surface.

The fourth substrate 50 is a substrate disposed on an outermost surface of the matching circuit board 10, and includes an electrode layer to which a voltage is directly applied by the bonding wire W4. The fourth substrate 50 is provided on the second substrate 30. The fourth substrate 50 includes an insulator 51 (fourth insulator), a metal pattern 52 (fourth metal pattern) provided on a main surface 51*a* of the insulator 51, and a conductive via 54 positioned in the metal pattern 52.

Similarly to the insulators 21, 31, and 41, the insulator 51 is, for example, a PCB substrate or an insulating substrate made of a ceramic material. The metal pattern 52 is formed to cover substantially the entire surface of the main surface 51*a* of the insulator 51 except for a peripheral edge. The bonding wire W4 is connected to the metal pattern 52. The metal pattern 52 is made of, for example, copper or silver.

The conductive via 54 is a conductive via for electrically connecting the metal pattern 52 of the fourth substrate 50 to the metal pattern 22 of the first substrate 20. The conductive via 54 is a conductive via made of a metal material provided on an inner peripheral surface of a through-hole penetrating the insulator 51 from a front surface to a back surface (or filled in the through-hole). The conductive via 54 is provided inside the metal pattern 52 in the planar direction. The conductive via 54 is connected and conductive to the metal pattern 52 on the front surface, and is electrically connected to the conductive via 34 of the second substrate 30 on the back surface. The metal pattern 52 is electrically connected to the metal pattern 22 and the conductive via 24 of the first substrate 20 by the conductive via 54 and the conductive via 34.

Figure 5:
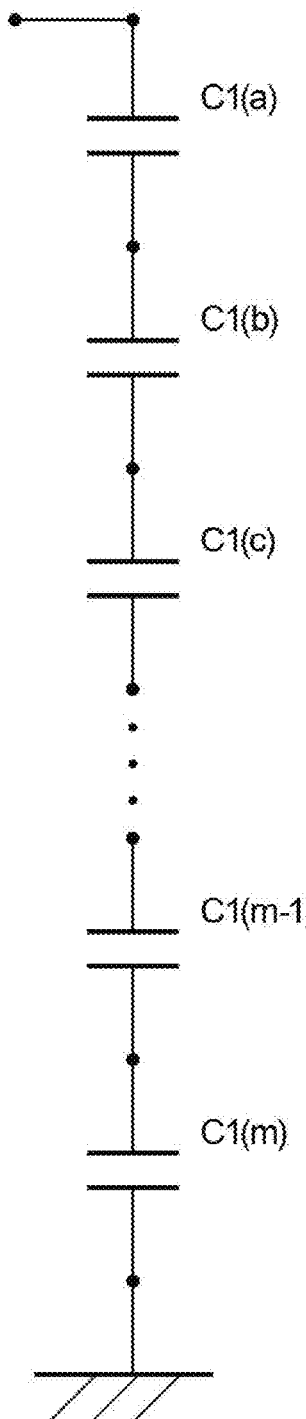
FIG. 5 is a diagram illustrating an example of the circuit of the matching circuit board illustrated in FIG. 4.

The matching circuit board 10 includes such a plurality of substrates. For example, the metal pattern 22, the insulator 31, and the metal pattern 32 constitute a first capacitor C1(*a*), and the metal pattern 22, the insulator 21, and the metal pattern 42 constitute a second capacitor C1(*b*). FIG. 5 illustrates an example of a circuit in a case where a plurality of capacitors C1(*a*) to C1(*m*) are formed. In the matching circuit board 10, the back-surface metal pattern 11 (see FIG. 2) is provided on a bottom surface of the third substrate 40 as a lowermost layer. In this case, the plurality of conductive vias 43 and 45 of the third substrate 40 electrically connect the metal pattern 42 to the back-surface metal pattern 11.

The back-surface metal pattern 11 is further connected to the base substrate 2 by the metal paste P.

Figure 10:
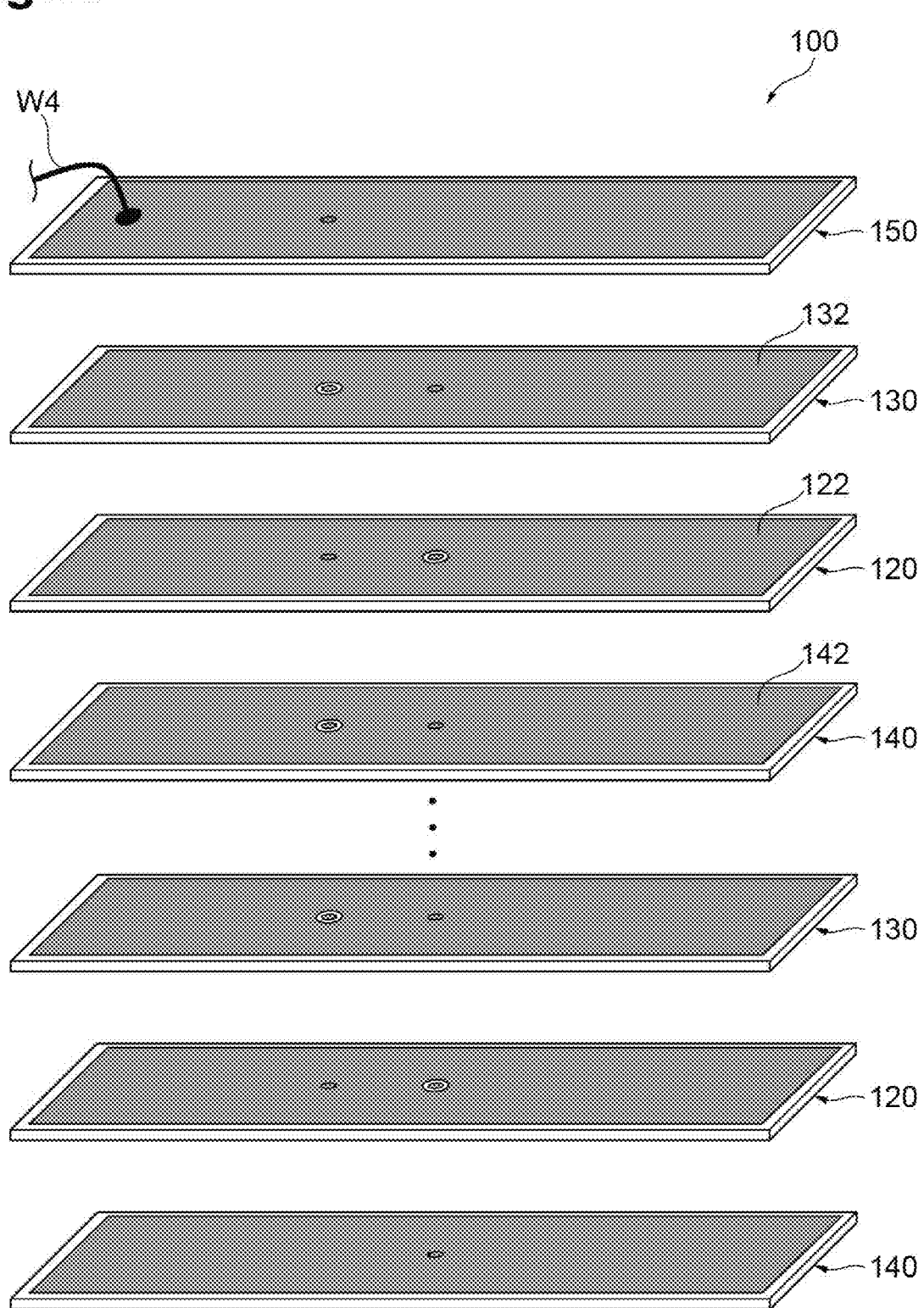
FIG. 10 is an exploded perspective view of a general matching circuit board.

Here, an effect of suppressing the migration of the metal paste P by the matching circuit board 10 according to the present embodiment will be described in comparison with a case where a general matching circuit component is used. FIG. 10 is an exploded perspective view of a general matching circuit component. A matching circuit board 100 illustrated in FIG. 10 includes a plurality of first substrates 120, a plurality of second substrates 130, a plurality of third substrates 140, and a fourth substrate 150. The first substrate 120, the second substrate 130, the third substrate 140, and the fourth substrate 150 correspond to the first substrate 20, the second substrate 30, the third substrate 40, and the fourth substrate 50 of the matching circuit board 10 described above, respectively. The matching circuit board 100 is different from the matching circuit board 10 in that the plurality of conductive vias 23, 33, and 43 are not provided at the peripheral edges of the first substrate, the second substrate, and the third substrate, and the metal pattern 122 of the first substrate 120 has substantially the same size as the metal patterns 132 and 142 of the second substrate 130 and the third substrate 140. In the semiconductor device including such a matching circuit board 100, when a negative voltage is applied to the first lead 4, the migration may occur in the metal paste P (silver paste) used when the matching circuit board 100 is implemented on the base substrate 2 due to the influence of the electric field generated by the voltage.

In contrast, in the matching circuit board 10 according to the present embodiment, the metal pattern 22 is positioned inside the plurality of conductive vias 23 to be separated from the plurality of conductive vias 23. Thus, the metal pattern 22 has a length and a width smaller than the metal pattern 32 or the metal pattern 42. As a result, the electric field leaking to an outside of the matching circuit board 10 (particularly, an outside of a side surface) decreases. In addition, in the matching circuit board 10 according to the present embodiment, the plurality of conductive vias 23 and the plurality of conductive vias 33 are disposed outside the metal pattern to which the voltage is applied. As a result, the electric field leaking to the outside of the matching circuit board 10 further decreases. From the above, according to the matching circuit board 10, the migration of the metal paste P is suppressed.

In the matching circuit board 10 according to the present embodiment, the third substrate 40 further includes the plurality of conductive vias 43 disposed at the peripheral edge of the insulator 41. As a result, the electric field leaking to the outside of the matching circuit board 10 further decreases. In addition, the matching circuit board 10 includes the back-surface metal pattern 11 provided on the back surface of the insulator 41 of the third substrate 40 as the lowermost layer. The metal pattern 42 is electrically connected to the back-surface metal pattern 11 through the plurality of conductive vias 43. As a result, the metal pattern 42 can be easily used as the ground electrode.

The matching circuit board 10 according to the present embodiment is configured such that a reference potential is supplied to at least one of the metal pattern 32 and the metal pattern 42. As a result, the metal pattern 32 and the metal pattern 42 can be easily used as the ground electrodes.

The semiconductor device 1 according to the present embodiment includes the matching circuit board 10, the transistor 6, and the base substrate 2 on which the matching circuit board 10 and the transistor 6 are mounted. In the semiconductor device 1, the matching circuit board 10 and the base substrate 2 are bonded with the metal paste P. In the semiconductor device 1, the electric field leaking to the outside of the matching circuit board 10 is reduced as described above. Thus, according to the semiconductor device 1, the migration of the metal paste P is suppressed.

[First Modification]

Figure 6:
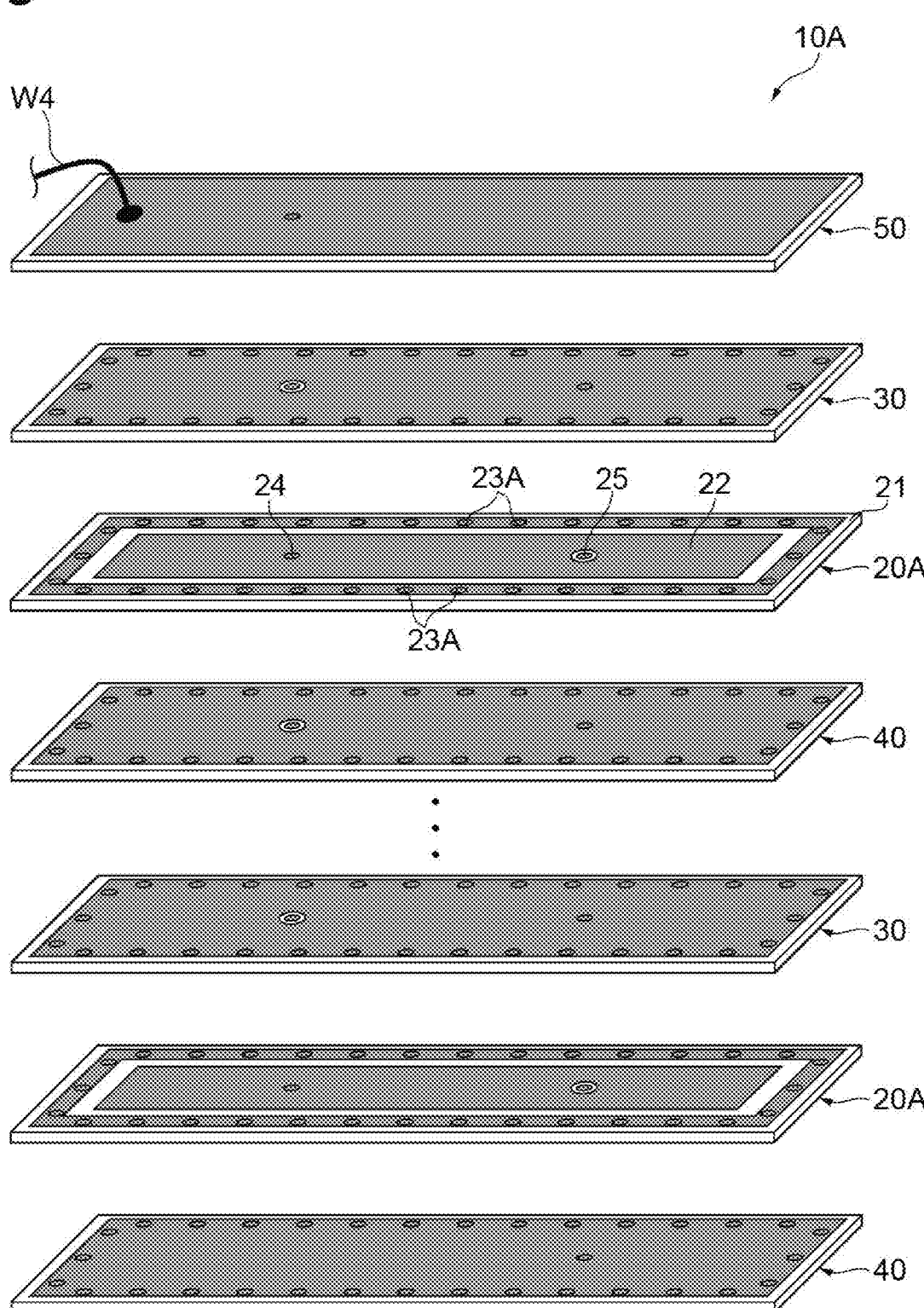
FIG. 6 is an exploded perspective view of a matching circuit board according to a first modification.

Next, a first modification of the matching circuit board 10 will be described with reference to FIG. 6. FIG. 6 is an exploded perspective view of a matching circuit board 10A according to the first modification. As illustrated in FIG. 6, the matching circuit board 10A according to the first modification includes a plurality of first substrates 20A, a plurality of second substrates 30, a plurality of third substrates 40, and a fourth substrate 50. The first substrate 20A of the matching circuit board 10A according to the first modification is different from the first substrate 20 of the matching circuit board 10. Other configurations (including an insulator and the like) of the matching circuit board 10A are similar to the configurations of the matching circuit board 10.

Similarly to the first substrate 20, the first substrate 20A is a substrate including an electrode layer to which a voltage is applied, and is disposed between the second substrate 30 and the third substrate 40. The first substrate 20A includes an insulator 21, a metal pattern 22 provided on a main surface 21a of the insulator 21, a plurality of conductive vias 23A disposed to surround a periphery of the metal pattern 22, a conductive via 24 positioned in the metal pattern 22, and a conductive via 25 positioned in the metal pattern 22. In the matching circuit board 10A, the plurality of conductive vias 23A are electrically connected to each other, and the plurality of conductive vias 23A has a guard ring structure surrounding the metal pattern 22. The conductive vias 23A having the guard ring structure are insulated from the metal pattern 22 similarly to the matching circuit board 10.

Even in such a matching circuit board 10A, it is possible to achieve operational effects similar to the operational effects of the matching circuit board 10 and the semiconductor device 1 described above. In addition, in the matching circuit board 10A, the plurality of conductive vias 23 are electrically connected to each other, and the plurality of conductive vias 23 have a guard ring structure surrounding the metal pattern 22. As a result, an electric field leaking to an outside of the matching circuit board 10A further decreases. Thus, according to the matching circuit board 10A, migration of a metal paste is further suppressed.

[Second Modification]

Figure 7:
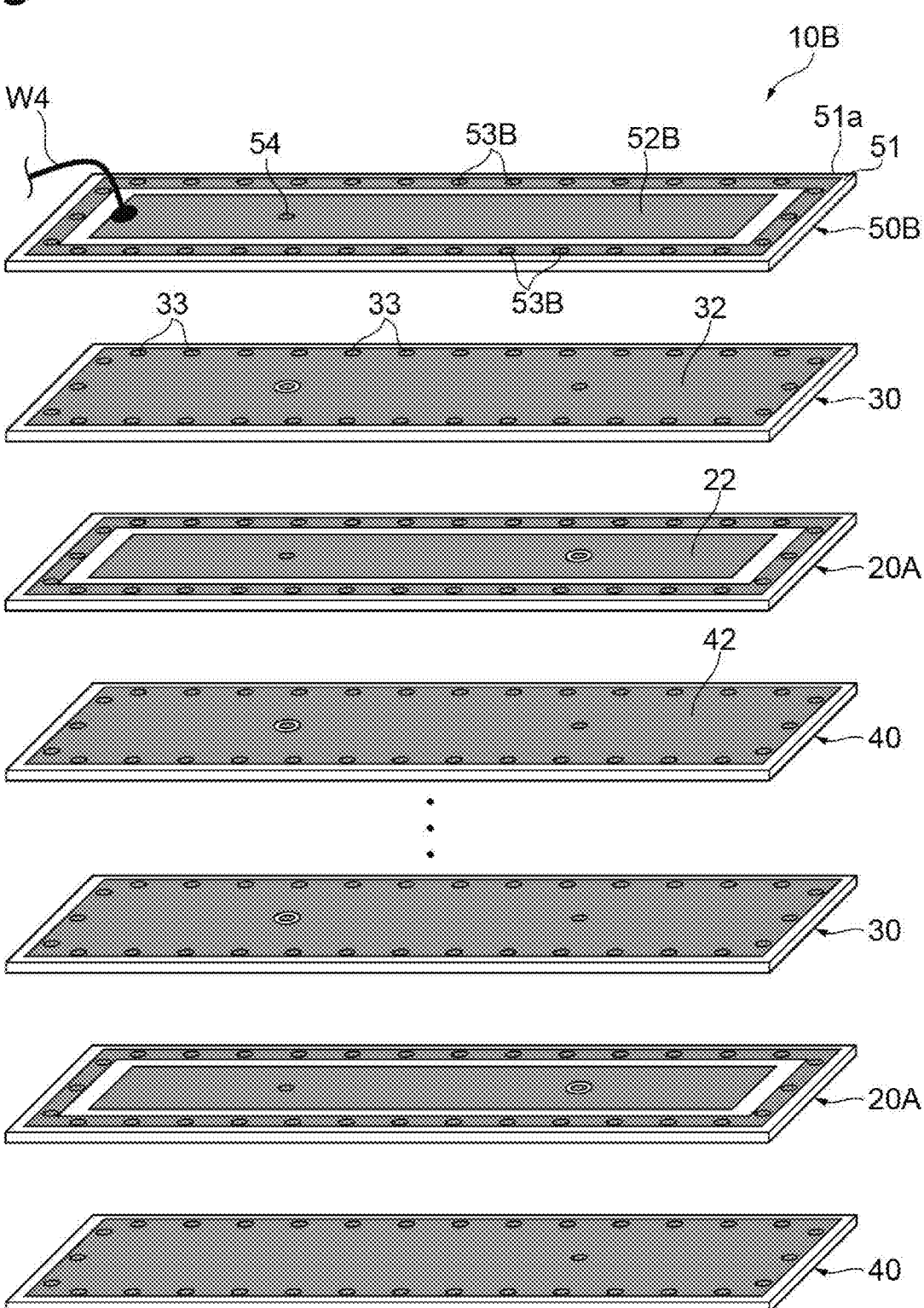
FIG. 7 is an exploded perspective view of a matching circuit board according to a second modification.

Next, a second modification of the matching circuit board 10 will be described with reference to FIG. 7. FIG. 7 is an exploded perspective view of a matching circuit board 10B according to the second modification. As illustrated in FIG. 7, the matching circuit board 10B according to the second modification includes a plurality of first substrates 20A, a plurality of second substrates 30, a plurality of third substrates 40, and a fourth substrate 50B. The fourth substrate 50B of the matching circuit board 10B according to the second modification is different from the fourth substrates 50 of the matching circuit boards 10 and 10A. Other configurations of the matching circuit board 10B are similar to the configurations of the matching circuit board 10A.

The fourth substrate 50B includes an insulator 51, a metal pattern 52B (fourth metal pattern) provided on the main surface 51a of the insulator 51, a plurality of conductive vias 53B (fourth conductive vias) disposed to surround a periphery of the metal pattern 52B, and a conductive via 54 positioned in the metal pattern 52B.

The metal pattern 52B is formed to cover a central region excluding the plurality of conductive vias 53B provided at a peripheral edge of the main surface 51a of the insulator 51. The metal pattern 52B is formed such that a size in a planar direction is smaller than a metal pattern 32 of the second substrate 30 or a metal pattern 42 of the third substrate 40. In addition, the size of the metal pattern 52B may be substantially the same as a size of a metal pattern 22. The metal pattern 52B may have a size of, for example, 50% or more and 90% or less with respect to an area of the metal pattern 32 or the metal pattern 42.

Each of the plurality of conductive vias 53B is a conductive via made of a metal material provided on an inner peripheral surface of a through-hole penetrating the insulator 51 from a front surface to a back surface (or filled in the through-hole). The conductive via 53B electrically connects an electrode positioned on the front surface of the insulator 51 to an electrode positioned on the back surface of the insulator 51. Each of the conductive vias 53B is disposed to be separated from each other in the planar direction. An isolation distance between the adjacent conductive vias 53B may be, for example, 50 μm or more and 500 μm or less. The plurality of conductive vias 53B are disposed at equal intervals, for example. The conductive via 53B is connected to a conductive via 33 of the second substrate 30 on the back surface.

In the matching circuit board 10B, the plurality of conductive vias 53B are electrically connected to each other, and the plurality of conductive vias 53B have a guard ring structure surrounding the metal pattern 52B. The conductive via 53B having the guard ring structure is insulated from metal pattern 52B similarly to the metal pattern 22 and the conductive via 23 in the first substrate 20.

Even in such a matching circuit board 10B, it is possible to achieve operational effects similar to the operational effects of the matching circuit boards 10 and 10A and the semiconductor device 1 described above. In addition, in the matching circuit board 10B, the plurality of conductive vias 53B are electrically connected to the metal pattern 32 and the conductive via 33, and the metal pattern 52B is positioned inside the conductive via 53B to be separated from the conductive via 53B and is configured to be insulated from the conductive via 53B. As a result, in the matching circuit board 10B, since the plurality of conductive vias 53B are disposed outside the metal pattern 52B to which the voltage is applied, an electric field leaking to an outside of the matching circuit board 10B further decreases. From the above, according to the matching circuit board 10B, migration of a metal paste is further suppressed.

In the matching circuit board 10B, the plurality of conductive vias 53B are electrically connected to each other, and the plurality of conductive vias 53B have a guard ring structure surrounding the metal pattern 52B. Thus, the electric field leaking to the outside of the matching circuit board 10B further decreases. Thus, according to the matching circuit board 10B, the migration of the metal paste is further suppressed.

[Third Modification]

Figure 8:
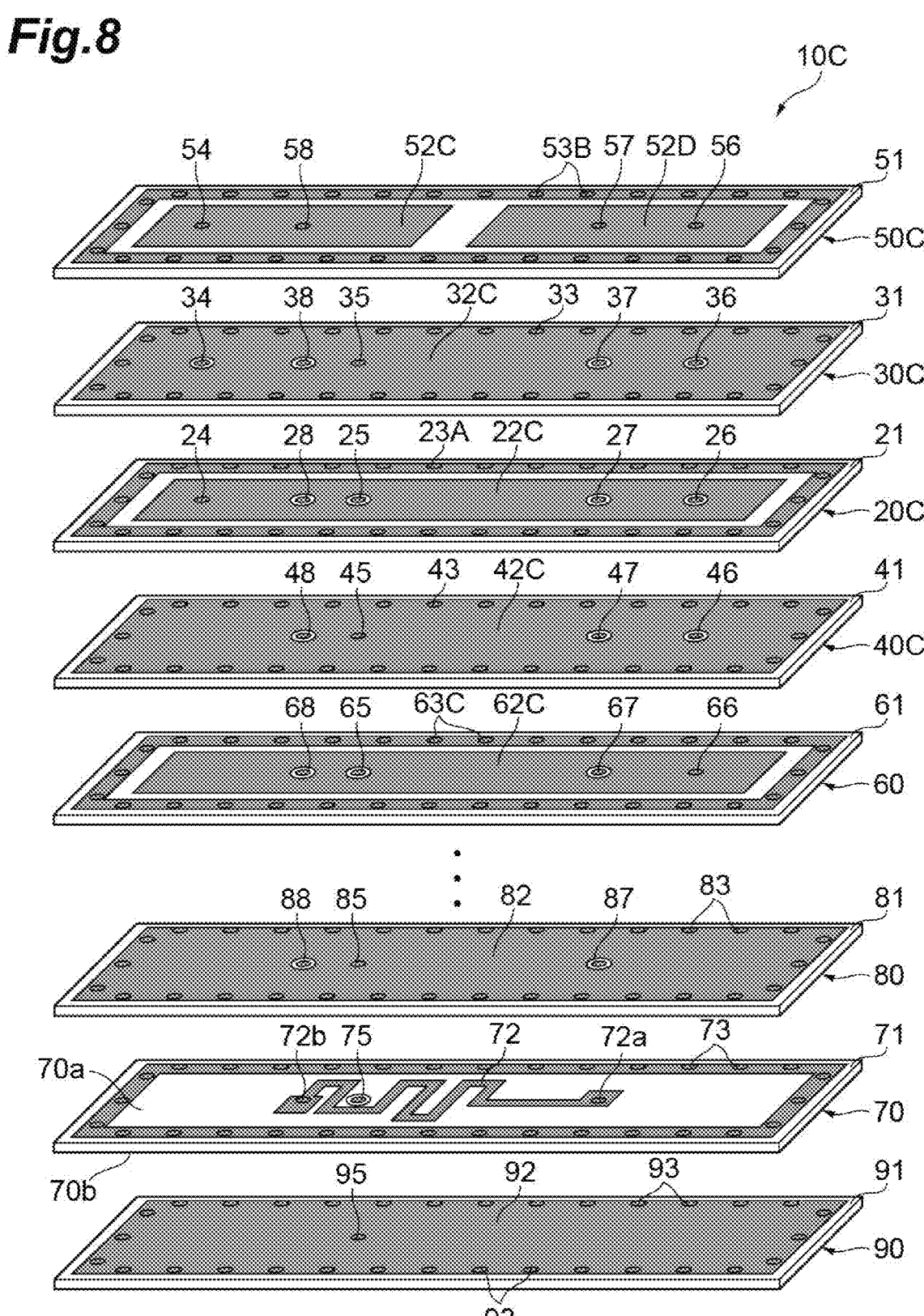
FIG. 8 is an exploded perspective view of a matching circuit board according to a third modification.
Figure 9:
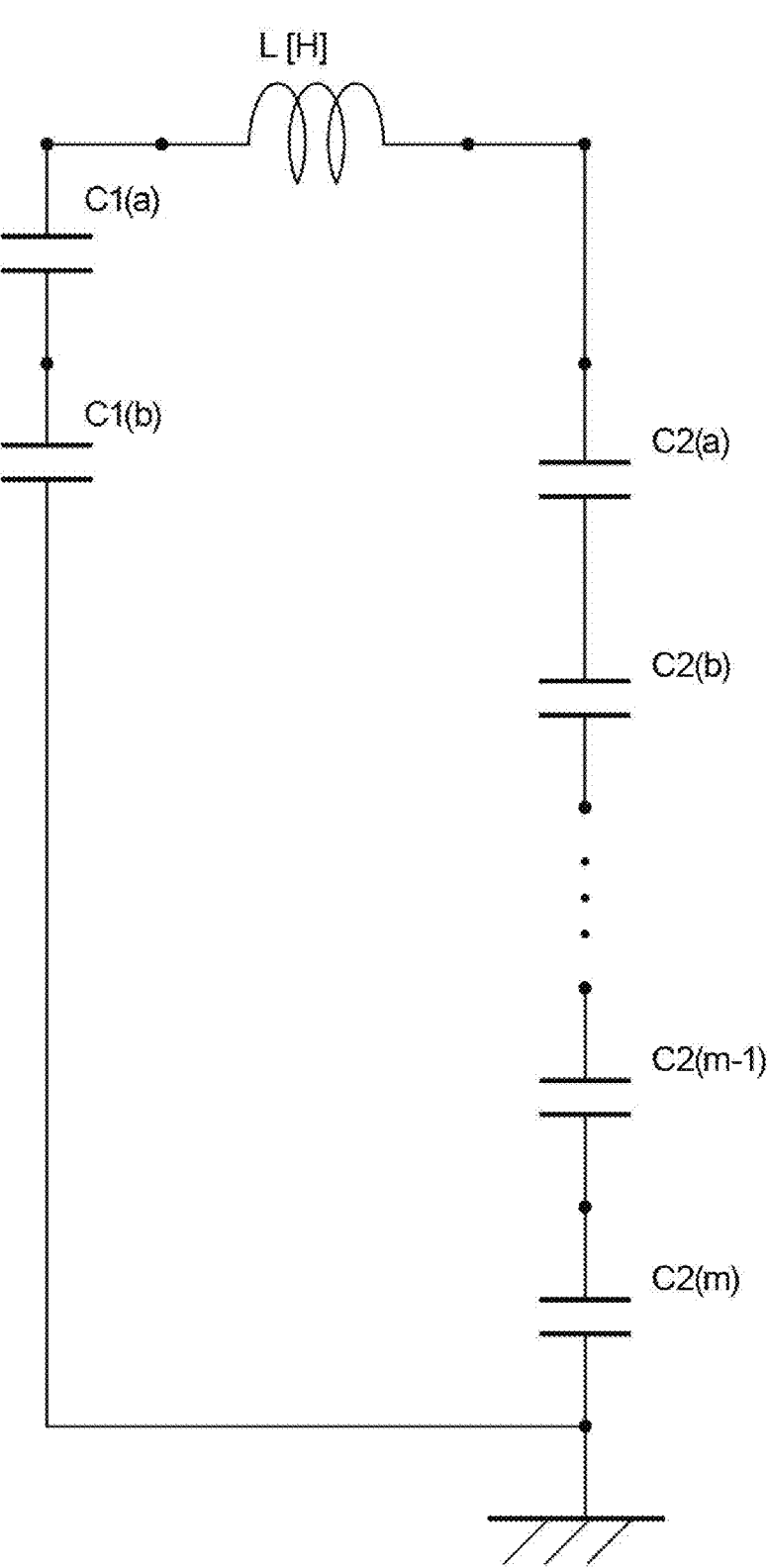
FIG. 9 is a diagram illustrating an example of a circuit of the matching circuit board illustrated in FIG. 8.

Next, a third modification of the matching circuit board 10 will be described with reference to FIG. 8. FIG. 8 is an exploded perspective view of a matching circuit board 10C according to the third modification. As illustrated in FIG. 8, the matching circuit board 10C according to the third modification includes a first substrate 20C, a second substrate 30C, a third substrate 40C, a fourth substrate 50C, and an eighth substrate 60. The matching circuit board 10C further includes a fifth substrate 70, a sixth substrate 80, and a seventh substrate 90. The first substrate 20C and the eighth substrate 60, the second substrate 30C, the third substrate 40C, and the fourth substrate 50C of the matching circuit board 10C according to the third modification correspond to the first substrate 20, the second substrate 30, the third substrate 40, and the fourth substrate 50 of the matching circuit board 10, respectively. However, since a metal pattern 72 (fifth metal pattern) is provided in the fifth substrate 70, the dispositions and the like of the conductive vias in the substrates are different. FIG. 9 is a diagram illustrating an example of a circuit formed by the matching circuit board 10C.

The first substrate 20C includes an insulator 21, a metal pattern 22C, a plurality of conductive vias 23A, and conductive vias 24, 25, 26, 27, and 28. The conductive vias 24 to 28 are positioned inside the metal pattern 22C in a planar direction, and the conductive vias 25 to 28 are provided to be insulated from the metal pattern 22C.

The second substrate 30C includes an insulator 31, a metal pattern 32C, a plurality of conductive vias 33, and conductive vias 34, 35, 36, 37, and 38. The conductive vias 34 to 38 are positioned inside the metal pattern 32C in the planar direction, and the conductive via 34 and the conductive vias 36 to 38 are provided to be insulated from the metal pattern 32C. The conductive via 35 is configured to be conductive to the metal pattern 32C.

The third substrate 40C includes an insulator 41, a metal pattern 42C, a plurality of conductive vias 43, and conductive vias 45, 46, 47, and 48. The conductive vias 45 to 48 are positioned inside the metal pattern 42C in the planar direction, and the conductive vias 46 to 48 are provided to be insulated from the metal pattern 42C. The conductive via 45 is configured to be conductive to the metal pattern 42C.

The fourth substrate 50C includes an insulator 51, a pair of metal patterns 52C and 52D (ninth metal pattern), a plurality of conductive vias 53B, and conductive vias 54, 56, 57, and 58. The conductive via 54 and the conductive vias 56 to 58 are positioned inside the metal patterns 52C and 52D in the planar direction, and all the conductive vias 54 and 56 to 58 are provided to be conductive to one of the pair of metal patterns 52C and 52D.

The eighth substrate 60 includes an insulator 61 (eighth insulator), a metal pattern 62C (eighth metal pattern), a plurality of conductive vias 63C (eighth conductive vias), and conductive vias 65, 66, 67, and 68. The conductive vias 65 to 68 are positioned inside the metal pattern 62C in the planar direction, and the conductive vias 65, 67, and 68 are provided to be insulated from the metal pattern 62C. The conductive via 66 is configured to be conductive to the metal pattern 62C.

The fifth substrate 70 is a substrate disposed between the sixth substrate 80 and the seventh substrate 90. The fifth substrate 70 includes an insulator 71 (fifth insulator), a metal pattern 72 (fifth metal pattern), a plurality of conductive vias 73 (a plurality of fifth conductive vias), and a conductive via 75. The metal pattern 72 forms an inductor and has a coil shape from one end 72a to the other end 72b.

Similarly to the conductive via 23A, the plurality of conductive vias 73 are formed at a peripheral edge of the insulator 71 to surround the metal pattern 72. The plurality of conductive vias 73 are disposed separated from each other in the planar direction. The plurality of conductive vias 73 are electrically connected to each other, and the plurality of conductive vias 73 have a guard ring structure surrounding the metal pattern 72. The conductive via 73 having the guard ring structure is insulated from the metal pattern 72 similarly to the metal pattern 22C and the conductive via 23A.

The sixth substrate 80 is provided to face a first surface 70a of the fifth substrate 70. The sixth substrate 80 has a configuration substantially similar to the configuration of the second substrate 30C, and includes an insulator 81 (sixth insulator), a metal pattern 82 (sixth metal pattern), a plurality of conductive vias 83 (sixth conductive vias), and conductive vias 85, 87, and 88. The conductive vias 85, 87, and 88 are positioned inside the metal pattern 82 in the planar direction, and the conductive vias 87 and 88 are provided to be insulated from the metal pattern 82. The conductive via 85 is configured to be conductive to the metal pattern 82.

The seventh substrate 90 is provided to face a second surface 70b of the fifth substrate 70. The seventh substrate 90 has a configuration substantially similar to the configuration of the second substrate 30C, and includes an insulator 91 (seventh insulator), a metal pattern 92 (seventh metal pattern), a plurality of conductive vias 93 (seventh conductive vias), and a conductive via 95. The conductive via 95 is positioned inside the metal pattern 92 in the planar direction, and the conductive via 95 is provided to be conductive to the metal pattern 92. The back-surface metal pattern 11 is provided on a back surface of the seventh substrate 90, and the metal pattern 92 and the back-surface metal pattern 11 are electrically connected to each other by the conductive vias 93 and 95.

In such a matching circuit board 10C, the conductive vias 54, 34, and 24 are conductive, and thus, the metal pattern 52C and the metal pattern 22C are electrically connected to each other. Similarly, the conductive vias 35, 25, 45, 65, 85, 75, and 95 are conductive, and thus, the metal patterns 32C, 42C, 82, and 92 are electrically connected to each other to function as ground electrodes. The conductive vias 56, 36, 26, 46, and 66 are conductive, and thus, the metal pattern 52D and the metal pattern 62C are electrically connected to each other. The conductive vias 57, 37, 27, 47, 67, and 87 and the one end 72a are conductive, and thus, the metal pattern 52D and the metal pattern 72 are electrically connected to each other. The conductive vias 58, 38, 28, 48, 68, and 88 and the other end 72b are conductive, and thus, the metal pattern 52C and the metal pattern 72 are electrically connected to each other.

In such a matching circuit board 10C, since the metal patterns 22C and 62C are smaller than the other metal patterns, an electric field leaking to an outside of the matching circuit board 10C (particularly, an outside of a side surface) decreases. In addition, in the matching circuit board 10C according to the present modification, the plurality of conductive vias 53B, 33, 23A, 43, 63C, 83, 73, and 93 are conductive to each other, and thus, these conductive vias are disposed outside the metal pattern to which the voltage is applied. As a result, the electric field leaking to the outside of the matching circuit board 10C further decreases. From the above, according to the matching circuit board 10C, migration of a metal paste P is suppressed, similarly to the matching circuit boards 10, 10A, and 10B and the semiconductor device 1 described above. Further, in the matching circuit board 10C, the metal pattern 72 of the fifth substrate 70 forms the inductor. The metal pattern 72 of the fifth substrate 70 and the pair of metal patterns 52C and 52D are connected via the plurality of conductive vias 27, 28, 37, 38, 47, 48, 57, 58, 67, 68, 87, and 88, and the plurality of vias also function as inductors. Thus, a larger inductance can be formed. As a result, an inductor which is a circuit unit other than the capacitor can be provided on the matching circuit board 10C, and various circuit configurations can be provided.

What is claimed is:

1. A matching circuit board comprising:

a first substrate that includes a first insulator, a first metal pattern provided on a main surface of the first insulator, and a plurality of first conductive vias provided at a peripheral edge of the first insulator;

a second substrate provided to face a first surface of the first substrate, the second substrate including a second insulator, a second metal pattern provided on a main surface of the second insulator, and a plurality of second conductive vias provided at a peripheral edge of the second insulator;

a third substrate provided to face a second surface opposite to the first surface of the first substrate, the third substrate including a third insulator and a third metal pattern provided on a main surface of the third insulator, wherein a first capacitor is constituted by the first metal pattern, the second insulator, and the second metal pattern, and a second capacitor is constituted by the first metal pattern, the first insulator, and the third metal pattern, wherein the second metal pattern is electrically connected to the third metal pattern through the plurality of second conductive vias and the plurality of first conductive vias, and wherein the first metal pattern is separated from the plurality of first conductive vias to be positioned inside the plurality of first conductive vias, and is configured to be insulated from the plurality of first conductive vias;

a fourth substrate provided on the second substrate, the fourth substrate including a fourth insulator, a fourth metal pattern provided on a main surface of the fourth insulator, and a plurality of fourth conductive vias provided at a peripheral edge of the fourth insulator, wherein the fourth metal pattern is electrically connected to the first metal pattern, and the plurality of fourth conductive vias are electrically connected to at least one of the second metal pattern and the second conductive vias, and wherein the fourth metal pattern is separated from the plurality of fourth conductive vias to be positioned inside the plurality of fourth conductive vias, and is configured to be insulated from the plurality of fourth conductive vias; and a fifth substrate provided to face the second surface of the first substrate and comprising a fifth insulator, a fifth metal pattern provided on a main surface of the fifth insulator, and a plurality of fifth conductive vias provided at a peripheral edge of the fifth insulator, wherein the fifth metal pattern forms an inductor.

2. The matching circuit board according to claim 1, wherein the third substrate includes a plurality of third conductive vias disposed at a peripheral edge of the third insulator and a back-surface metal pattern provided on a bottom surface opposite to the main surface of the third insulator, and wherein the third metal pattern is electrically connected to the back-surface metal pattern through the plurality of third conductive vias.

3. The matching circuit board according to claim 1, wherein the plurality of first conductive vias are electrically connected to each other, and the plurality of first conductive vias have a guard ring structure surrounding the first metal pattern.

4. The matching circuit board according to claim 1, wherein the plurality of fourth conductive vias are electrically connected to each other, and the plurality of fourth conductive vias have a guard ring structure surrounding the fourth metal pattern.

5. The matching circuit board according to claim 1, wherein a reference potential is supplied to at least one of the second metal pattern and the third metal pattern.

6. The matching circuit board according to claim 1, further comprising:

a sixth substrate provided to face a first surface of the fifth substrate, the sixth substrate including a sixth insulator, a sixth metal pattern provided on a main surface of the sixth insulator, and a plurality of sixth conductive vias provided at a peripheral edge of the sixth insulator; and a seventh substrate provided to face a second surface opposite to the first surface of the fifth substrate, the seventh substrate including a seventh insulator, a seventh metal pattern provided on a main surface of the seventh insulator, and a plurality of seventh conductive vias provided at a peripheral edge of the seventh insulator, wherein the sixth metal pattern and the seventh metal pattern are electrically connected each other through the plurality of fifth conductive vias and the plurality of sixth conductive vias.

7. The matching circuit board according to claim 6, further comprising:

an eighth substrate provided to face a first surface of the sixth substrate, the eighth substrate including an eighth insulator, an eighth metal pattern provided on a main surface of the eighth insulator, and a plurality of eighth conductive vias provided at a peripheral edge of the eighth insulator, wherein a ninth metal pattern is provided to be separated from the fourth metal pattern on the main surface of the fourth insulator, and the ninth metal pattern is electrically connected to the eighth metal pattern, wherein the plurality of fourth conductive vias are electrically connected to at least one of the third metal pattern and the eighth conductive vias, and wherein the ninth metal pattern is separated from the plurality of fourth conductive vias to be positioned inside the plurality of fourth conductive vias, and is configured to be insulated from the plurality of fourth conductive vias.

8. The matching circuit board according to claim 7, wherein the fifth metal pattern is electrically connected to the fourth metal pattern and the ninth metal pattern.

9. The matching circuit board according to claim 8, wherein the fifth metal pattern includes a first end and a second end, the first end being connected to the ninth metal pattern and the second end being connected to the fourth metal pattern.

10. The matching circuit board according to claim 1, wherein a size of the first metal pattern is smaller than a size of at least one of the second metal pattern and the third metal pattern.

11. The matching circuit board according to claim 10, wherein the first metal pattern has a size of 50% or more with respect to an area of at least one of the second metal pattern and the third metal pattern.

12. The matching circuit board according to claim 11, wherein the first metal pattern has a size of 90% or less with respect to an area of at least one of the second metal pattern and the third metal pattern.

13. The matching circuit board according to claim 1, wherein the plurality of first conductive vias surround the first metal pattern.

14. The matching circuit board according to claim 1, wherein each distance between adjacent conductive vias of the plurality of first conductive vias is between 50 μm and 500 μm.

15. A semiconductor device comprising:

the matching circuit board according to claim 1;

a semiconductor element; and a base substrate that mounts the matching circuit board and the semiconductor element thereon, wherein the matching circuit board and the base substrate are bonded by a metal paste.

* * * * *